(12) United States Patent
Markhart et al.

(10) Patent No.: US 11,325,369 B2
(45) Date of Patent: May 10, 2022

(54) SYSTEM FOR THERMAL DEVELOPMENT OF FLEXOGRAPHIC PRINTING PLATES

(71) Applicant: MacDermid Graphics Solutions LLC, Waterbury, CT (US)

(72) Inventors: Gary T. Markhart, Temecula, CA (US); Ryan W. Vest, Mequon, WI (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 71 days.

(21) Appl. No.: 16/939,775

(22) Filed: Jul. 27, 2020

(65) Prior Publication Data

US 2022/0024198 A1 Jan. 27, 2022

(51) Int. Cl.
*B41C 1/055* (2006.01)
*G03F 7/36* (2006.01)

(52) U.S. Cl.
CPC ............... *B41C 1/055* (2013.01); *G03F 7/36* (2013.01)

(58) Field of Classification Search
CPC ...................................................... G03F 7/36
See application file for complete search history.

(56) References Cited

U.S. PATENT DOCUMENTS

| | | | |
|---|---|---|---|
| 3,264,103 A | 8/1966 | Cohen | |
| 5,175,072 A | 12/1992 | Martens | |
| 5,262,275 A | 11/1993 | Fan | |
| 5,279,697 A | 1/1994 | Peterson | |
| 5,925,500 A | 7/1999 | Yang | |
| 6,238,837 B1 | 5/2001 | Fan | |
| 6,605,410 B2 | 8/2003 | Yang | |
| 6,797,454 B1* | 9/2004 | Johnson | G03F 7/34 101/463.1 |
| 7,044,055 B2 | 5/2006 | Gotsick | |
| 7,152,529 B2 | 12/2006 | Gotsick | |
| 2003/0180655 A1 | 9/2003 | Fan | |
| 2003/0211423 A1 | 11/2003 | Mengel | |
| 2004/0146806 A1 | 7/2004 | Roberts | |
| 2005/0084791 A1* | 4/2005 | Hackler | G03F 7/36 430/200 |
| 2007/0051262 A1* | 3/2007 | Gotsick | B41C 1/055 101/401.1 |
| 2019/0022994 A1* | 1/2019 | Schadebrodt | G03F 7/202 |

FOREIGN PATENT DOCUMENTS

| | | |
|---|---|---|
| EP | 1239329 A3 | 7/2008 |
| WO | 0118604 A2 | 3/2001 |
| WO | 0188615 A1 | 11/2001 |

* cited by examiner

*Primary Examiner* — Chanceity N Robinson
(74) *Attorney, Agent, or Firm* — Carmody Torrance Sandak & Hennessey LLP

(57) ABSTRACT

The present disclosure is directed to a thermal developing assembly that is configured to reduce (or eliminate) the reactivity of contaminants and/or unreacted photosensitive material associated with forming a relief image on a photosensitive printing element during thermal development. The thermal developing assembly is configured to reduce (or eliminate) the reactivity of a byproduct associated with forming a relief image on a photosensitive printing element, the byproduct including but not limited to, contaminants within vapors (e.g., fumes), contaminants within condensate, unreacted photosensitive material, and combinations thereof.

19 Claims, 5 Drawing Sheets

SYSTEM FOR THERMAL DEVELOPMENT OF FLEXOGRAPHIC PRINTING PLATES

FIELD OF THE INVENTION

The present disclosure generally relates to a system and method for forming a relief structure suitable for flexographic printing and, more generally, a system and method configured to reduce (or eliminate) the reactivity of vapor and/or liquid byproducts associated with forming a relief image on a photosensitive printing element in a thermal developing assembly.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

A typical flexographic printing plate as delivered by its manufacturer, is a multilayered article made of, in order, a backing or support layer, one or more unexposed photocurable layers, a protective layer or slip film, and a cover sheet.

A flexographic printing element is produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas. The photocurable printing blank contains one or more layers of an uncured photocurable material on a suitable backing layer. The photocurable printing blank can be in the form of a continuous (seamless) sleeve or as a flat, planar plate that is mounted on a carrier.

The photopolymers used generally contain binders, monomers, photoinitiators, and other performance additives. Photopolymer compositions include those described in U.S. Patent Application Publication No. 2004/0146806, the teachings of which are incorporated herein by reference in their entirety. Various photopolymers such as those based on polystyrene-isoprene-styrene, polystyrene-butadiene-styrene, polyurethanes and/or thiolenes as binders are useful. Preferable binders are polystyrene-isoprene-styrene, and polystyrene-butadiene-styrene, especially block co-polymers of the foregoing.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer that is sensitive to laser ablation. A laser is then used to ablate selected areas of the actinic radiation opaque layer creating an in situ negative. This technique is well-known in the art and is described for example in U.S. Pat. Nos. 5,262,275 and 6,238,837 to Fan, and in U.S. Pat. No. 5,925,500 to Yang et al., the subject matter of each of which is herein incorporated by reference in its entirety. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Next, the photopolymer layer of the printing element is developed to remove uncured (i.e., non-crosslinked) portions of the photopolymer, without disturbing the cured portions of the photopolymer layer, to produce the relief image. The development step can be accomplished in a variety of ways, including water washing, solvent washing, and thermal development (blotting). Thermal development has the advantage of not requiring an additional drying step after development and thus provides the ability to go more quickly from plate to press.

Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. U.S. 2003/0180655, and U.S. 2003/0211423, and in WO01/88615, WO01/18604, and EP1239329, the teachings of each of which are incorporated herein by reference in their entirety. These processes allow for the elimination of development solvents and the lengthy plate drying times needed to remove the solvent. The speed and efficiency of these processes allow for their use in the manufacture of flexographic plates for printing newspapers and other publications where quick turnaround times and high productivity are important.

In order for the printing plate to be thermally developable, the composition of the photopolymer must be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts and/or substantially softens while the cured photopolymer remains solid and intact at the temperature chosen. Thus, the difference in melt temperature allows the uncured photopolymer to be selectively removed thereby creating the desired image.

During thermal development, the printing element is generally heated to a temperature of at least about 140° C. The exact temperature depends upon the properties of the particular photopolymer being used. However, two primary factors should be considered in determining the development temperature: 1. The development temperature is preferably set between the melt temperature of the uncured photopolymer on the low end and the melt temperature of the cured photopolymer on the upper end. This will allow selective removal of the photopolymer, thereby creating the image. 2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Thereafter, uncured photopolymer can be softened and/or melted and removed. In most instances, the heated printing element is contacted with an absorbent material that absorbs or otherwise removes the softened and/or melted uncured photopolymer. This removal process is generally referred to as "blotting."

Upon completion of the blotting process, the printing plate element may be post-exposed to further actinic radiation and/or subjected to detackification, cooled and is then ready for use.

During the thermal development process, vapors are released into the enclosure as the uncured photopolymer is heated. U.S. Pat. Nos. 7,044,055 and 7,152,529, both to Gotsick et al., the subject matter of each is herein incorporated by reference in its entirety, describe a system and method for forming a relief image on a photosensitive printing element including a closed loop ventilation system for treating vapors resulting from the removal of uncrosslinked portions of the radiation curable layer of the flexographic printing plate, the vapors including volatile organic compounds and other contaminants. The volatile organic compounds are absorbed by a filtering system within the ventilation system and purified air is reintroduced into an enclosure of the system. A disadvantage of the disclosed ventilation system is that the volatile organic compounds and other contaminants captured by the filtering system, although removed from the enclosure, remain liquid and thus are reactive, thereby potentially exposing a user to the irritants of photopolymer material during filter removal/cleaning. The vapors may also contain contaminants and irritants of photopolymer material that may be harmful to the environment and the user.

Based on the foregoing, there is a need in the art for an improved system and method for treating at least vapors resulting from the removal of uncrosslinked portions of the radiation curable layer of the flexographic printing plate. Particularly, an improved system and method that would eliminate the reactivity of contaminants and unreacted photosensitive material is desirable. These and other inefficiencies and opportunities for improvement are addressed and/or overcome by the assemblies, systems and methods described in the present disclosure.

SUMMARY OF THE INVENTION

The present disclosure provides an advantageous thermal-based developing system and method for forming a relief image on a photosensitive printing element. In particular, the present disclosure is directed to a thermal-based developing system that is configured to reduce (or eliminate) the reactivity of contaminants and/or unreacted photosensitive material associated with forming a relief image on a photosensitive printing element. Even more particularly, the present disclosure is directed to a thermal-based developing system that is configured to reduce (or eliminate) the reactivity of a byproduct associated with forming a relief image on a photosensitive printing element, the byproduct including but not limited to, contaminants within vapors (e.g., fumes), contaminants within condensate, unreacted photosensitive material, and combinations thereof.

For ease of discussion, a byproduct of the disclosed thermal-based developing system may include vapor(s), condensate(s), uncured photosensitive material(s), contaminant(s) or combinations thereof, unless otherwise stated. Thus, it should be appreciated that reference to "byproduct," "byproduct of forming a relief image on a photosensitive printing element," "byproduct of the thermal-based developing system," "byproduct of the developing system," "byproduct of the system," "vapor and/or liquid byproduct(s)," or any combinations thereof or alternatives thereof that would be appreciated by a person skilled in the art in view of present disclosure.

In one embodiment, the present disclosure relates generally to a system for treating vapor and/or liquid byproducts produced in a thermal development process of making a relief image printing element, wherein a photosensitive printing element includes a flexible substrate and at least one layer of photosensitive material deposited on the flexible substrate, the system including an enclosure, a conveyor including a continuous loop wherein the photosensitive printing element is positionable on the continuous loop of the conveyor, at least one mounted heatable roller in the enclosure, and an absorbent material covering at least a portion of the at least one heatable roller, wherein the absorbent material is capable of absorbing liquefied or softened uncured photosensitive material from the photosensitive printing element when the photosensitive printing element is heated and comes into contact with the absorbent material on a portion of the at least one heatable roller, and means for collecting and/or delivering vapor and/or liquid byproducts produced in the thermal development process when the photosensitive printing element is heated and a portion of the photosensitive printing element liquefies and softens, wherein at least one UV light source crosslinks and cures the vapor and/or liquid byproducts.

In another embodiment, the present disclosure relates generally to a system for treating liquid condensate produced in a thermal development process of making a relief image printing element, wherein the liquid condensate is produced during the heating of a photosensitive printing element wherein a portion of the photosensitive printing element liquefies and softens, wherein the photosensitive printing element includes a flexible substrate and at least one layer of photosensitive material deposited on the flexible substrate, the system including an enclosure, a conveyor including a continuous loop wherein the photosensitive printing element is positionable on the continuous loop of the conveyor, at least one mounted heatable roller in the enclosure, an absorbent material covering at least a portion of the at least one heatable roller, wherein the absorbent material is capable of absorbing liquefied or softened uncured photosensitive material from the photosensitive printing element when the photosensitive printing element is heated and comes into contact with the absorbent material on a portion of the at least one heatable roller, a pumping device configured to deliver the liquid condensate from a collection area to a surface of the absorbent material, wherein the absorbent material is capable of absorbing the liquid condensate, and at least one UV light source mounted with respect to the absorbent material, wherein the at least one UV light source crosslinks and cures at least the liquid condensate.

As used throughout, the absorbent material may also be referred to as a "blotter," "blotting material," or "absorbent web," without departing from the spirit/scope of this disclosure.

In some embodiments, the system may include a means for collecting and delivering the vapor, the condensate, the uncured photosensitive material, and combinations thereof (i.e., byproduct) from a first position to a second position relative to the enclosure. For example, the second position may be in close proximity to or touching at least a portion of the absorbent material. Particularly, the byproduct may be pumped from the first position to the second position, which is at least in close proximity to the absorbent material, such that the absorbent material may absorb the byproduct.

In some embodiments, the system includes one or more light sources. In other embodiments, the system includes one or more light sources positioned in close proximity to at least a portion of the absorbent material. In a non-limiting example, the one or more light sources may be a UV light source, for example, a UV light source configured for UV LED(s) and/or UV fluorescent light(s). In a nonlimiting example, the absorbent material may be exposed to a UV light source (or a plurality of UV light sources). Particularly, the absorbent material, containing one or more byproducts, may be exposed to the light source such that at least the byproduct(s) (e.g., vapor and/or liquid byproduct) crosslinks and cures for subsequent removal.

In some embodiments, the vapor may be condensed with a heat exchanger and the system may include a means for collecting the condensate. For example, the condensate may be absorbed by the web of absorbent material and the web of absorbent material may then be exposed to the UV light source. In doing so, the cured byproduct is rendered nonreactive and may be easily and safely disposed of, thereby eliminating the potential for user or environmental contact with the potentially reactive byproduct.

In another embodiment, the byproduct may be cured separate and apart from the absorbent material. Thus, the byproduct may not be absorbed by the absorbent material but is rather exposed to a light source and collected as a hardened material. In one instance, the system may include a means for collecting the byproduct in a filter, wherein the filter and the uncured byproduct are exposed to the UV light source. For example, contaminants of the vapor byproduct may be collected in a filter and the filter may then be exposed to the UV light source until the vapor byproduct and contaminants are cured. In another instance, the system may include a means for collecting the byproduct (e.g., condensate) within a container (e.g., a supplementary tank). The collected byproduct may be exposed to the UV light source. The cured byproduct may include pellets and/or solid particles which may then be collected and disposed of.

In another embodiment, the system may include a means for collecting the byproduct in one or more carbon filters in which the byproduct remains in liquid form. The carbon filter, containing the vapor and/or liquid byproduct, may then be exposed to the light source, thereby crosslinking and curing the byproduct.

Any combination or permutation of features, functions and/or embodiments as disclosed herein is envisioned. Additional advantageous features, functions and applications of the disclosed systems and methods of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale, and in certain views, parts may have been exaggerated or removed for purposes of clarity.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure.

Figure 1:
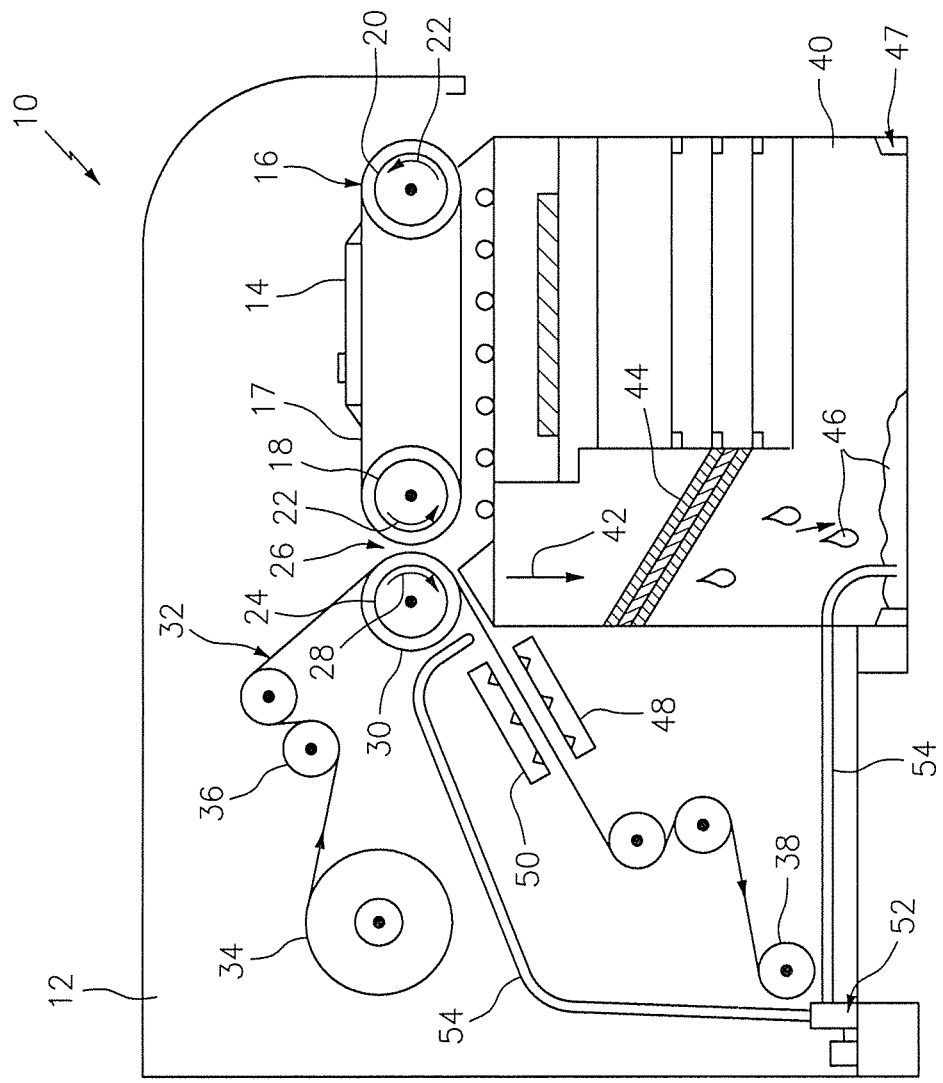
Figure 2:
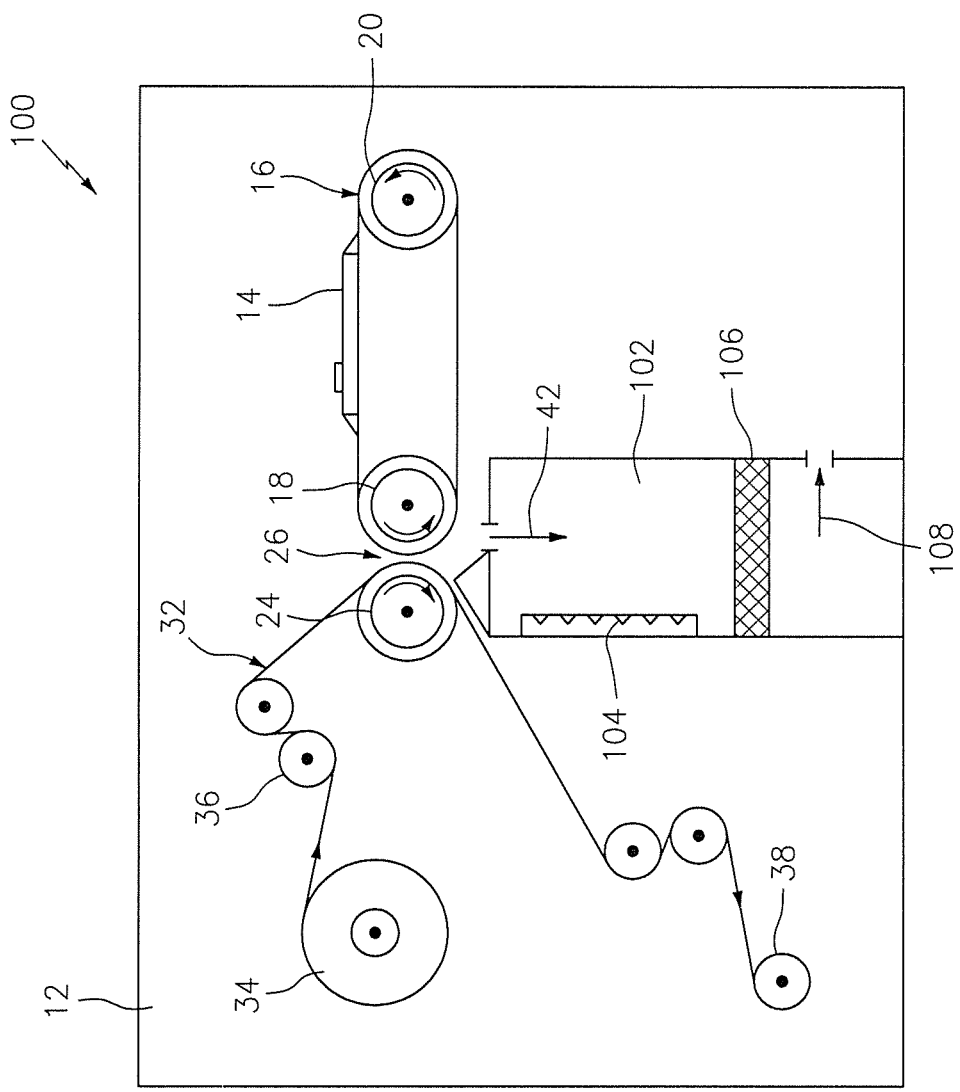
Figure 3:
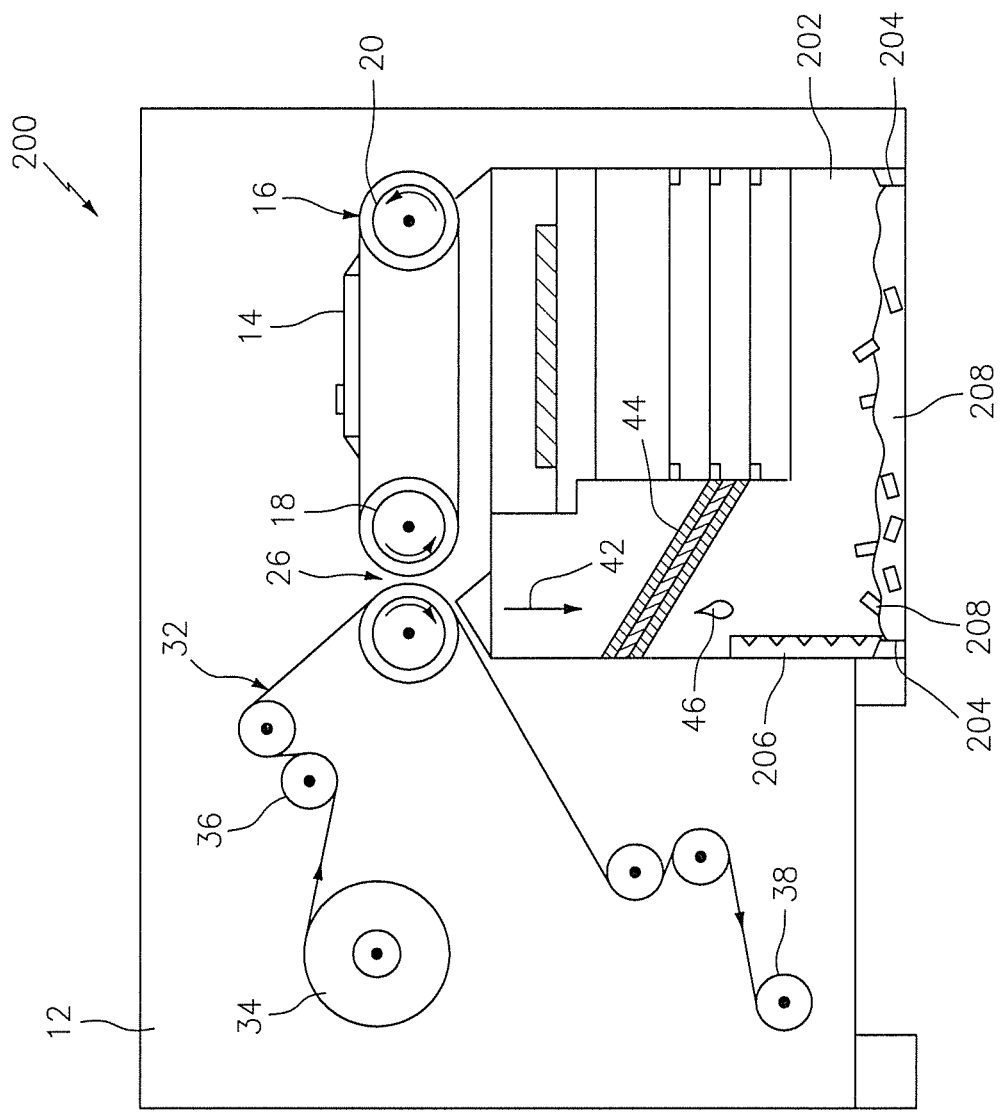
Figure 4A:
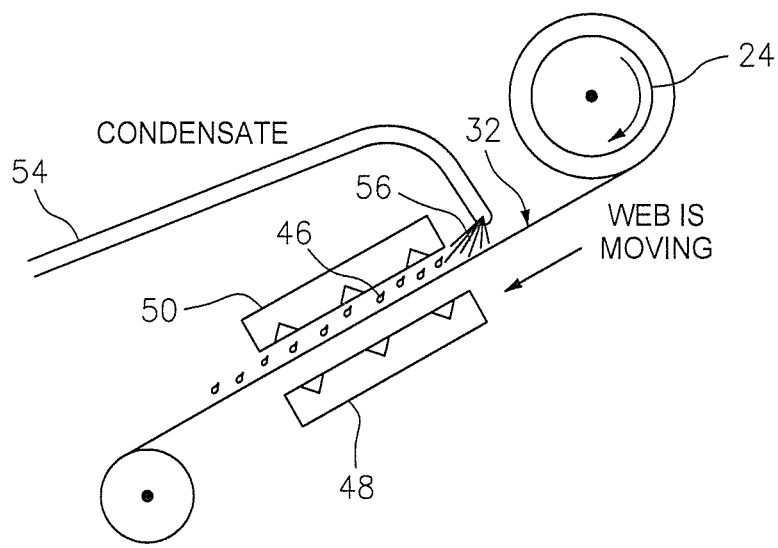
Figure 4B:
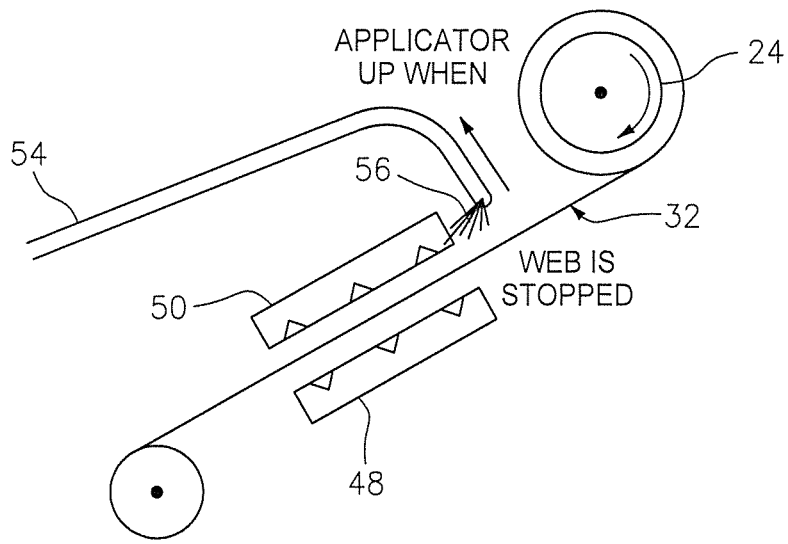
Figure 4C:
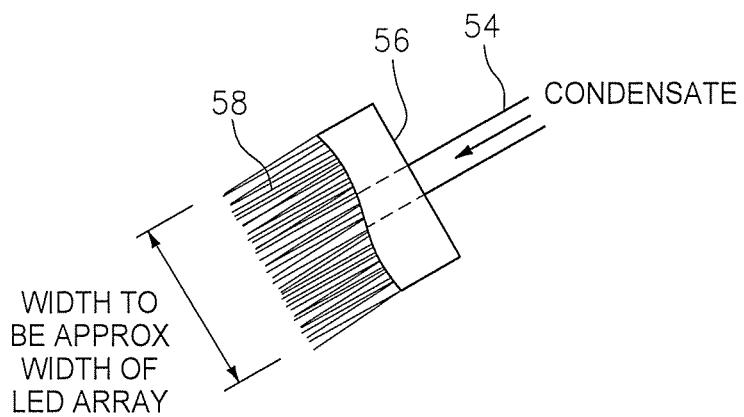
Figure 5:
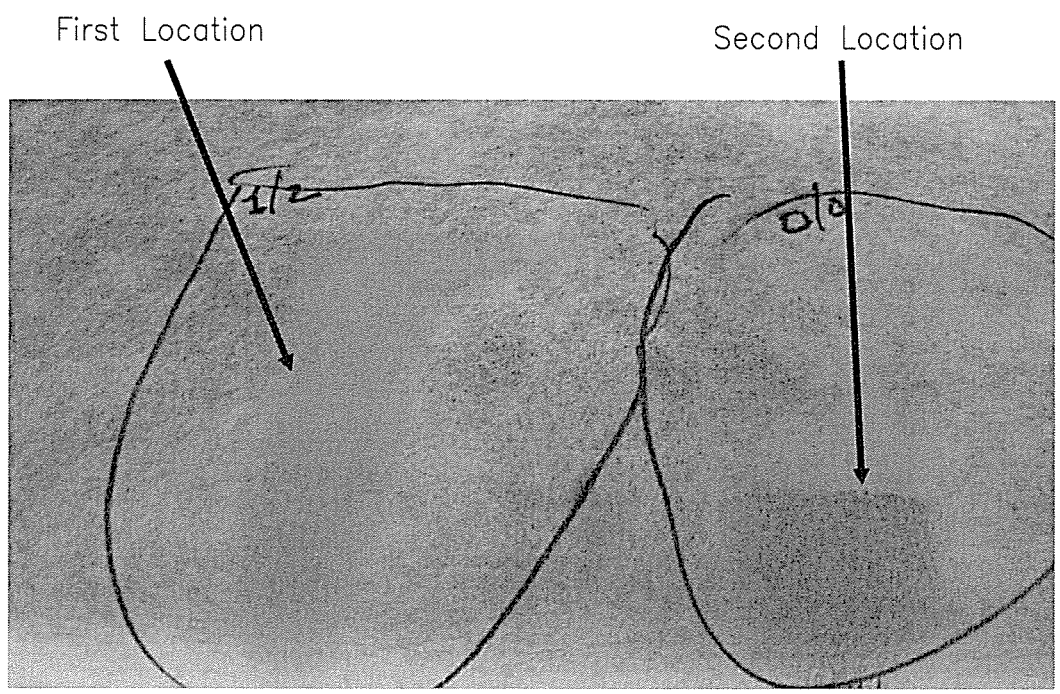

To assist those of ordinary skill in the art in making and using the disclosed assemblies, systems and methods, reference is made to the appended figures, wherein:

FIG. 1 schematically depicts a cross-sectional view of an exemplary thermal-based developing system according to the present disclosure;

FIG. 2 schematically depicts a cross-sectional view of an exemplary thermal-based developing system according to the present disclosure;

FIG. 3 schematically depicts a cross-sectional view of an exemplary thermal-based developing system according to the present disclosure;

FIGS. 4A-4B schematically depict a side view of an exemplary thermal-based developing system including an applicator and FIG. 4C schematically depicts a top view of the advantageous applicator, according to the present disclosure; and FIG. 5 illustrates an absorbent material with liquid condensate exposed to a UV light source according to Example 1 of the present disclosure.

Like parts are marked throughout the specification and drawings with the same reference numerals, respectively.

DETAILED DESCRIPTION OF THE INVENTION

The present disclosure provides an advantageous thermal-based developing system and method configured to reduce (or eliminate) the reactivity of a byproduct associated with thermally developing a relief image formed on a photosensitive printing element, the byproduct including but not limited to, contaminants within vapors (e.g., fumes), contaminants within condensate, unreacted photosensitive material (e.g., radiation curable layer), and combinations thereof.

It should be understood, however, that the disclosed embodiments are merely illustrative of the present disclosure, which may be embodied in various forms. Therefore, details disclosed herein with reference to exemplary assemblies/fabrication methods and associated processes/techniques of assembly and use are not to be interpreted as limiting, but merely as the basis for teaching one skilled in the art how to make and use the advantageous assemblies/systems of the present disclosure.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprise(s)" and/or "comprising," specify the presence of stated features, integers, steps, operations, elements, and/or components, but do not preclude the presence or addition of one or more other features, integers, steps, operations, elements, components, and/or groups thereof.

In one embodiment, and as shown in FIG. 1, the present invention relates generally to a thermal developing assembly comprising a system 10 for treating vapor and/or liquid byproducts 42, 46 produced in the thermal developing assembly used to process a relief image printing element. The photosensitive printing element 14 typically includes a flexible substrate and at least one layer of photosensitive material deposited on the flexible substrate.

The system 10 includes an enclosure 12, a conveyor 16 including a continuous loop 17 wherein the photosensitive printing element 14 is positionable on the continuous loop 17 of the conveyor 16, at least one mounted heatable roller 24 in the enclosure 12, an absorbent material 32 covering at least a portion of the at least one heatable roller 24, wherein the absorbent material 32 is capable of absorbing liquefied or softened uncured photosensitive material from the photosensitive printing element 14 when the photosensitive printing element 14 is brought into contact with the absorbent material 32 on a portion of the at least one heatable roller 24, and means for collecting and/or delivering vapor and/or liquid byproducts 42, 46 produced in the thermal development process when the photosensitive printing element 14 is heated and a portion of the photosensitive printing element 14 liquefies and softens, wherein at least one UV light source 48, 50 crosslinks and cures the vapor and/or liquid byproducts 42, 46.

In another embodiment, the present invention relates generally to a thermal developing assembly including a system 10 for treating liquid condensate 46 produced in the thermal developing assembly used to process a relief image printing element, wherein the liquid condensate 46 is produced during the heating of a photosensitive printing element 14 wherein a portion of the photosensitive printing element 14 liquefies and softens. The photosensitive printing element 14 typically includes a flexible substrate and at least one layer of photosensitive material deposited on the flexible substrate.

The system 10 including an enclosure 12, a conveyor 16 including a continuous loop 17 wherein the photosensitive printing element 14 is positioned on the continuous loop 17 of the conveyor 16, at least one mounted heatable roller 24 in the enclosure 12, an absorbent material 32 covering at least a portion of the at least one heatable roller 24, wherein the absorbent material 32 is capable of absorbing liquefied or softened uncured photosensitive material from the photosensitive printing element 14 when the photosensitive printing element 14 is brought into contact with the absorbent material 32 on a portion of the at least one heatable roller 24. In this embodiment, a pumping device 52 is configured to deliver the liquid condensate 46 from a collection area 47 to a surface of the absorbent material 32, wherein the absorbent material 32 is capable of absorbing the liquid condensate 46, and at least one UV light source 48, 50 mounted with respect to the absorbent material 32, wherein the at least one UV light source 48, 50 crosslinks and cures at least the liquid condensate 46.

With further reference to FIG. 1, the system 10 for processing the photosensitive printing element 14 includes an enclosure 12 for housing at least the elements of the thermal-based developing system 10.

The thermal-based developing system 10 of the present invention accepts a previously formed and imagewise actinic radiation exposed flexible photosensitive printing element 14, the photosensitive printing element 14 having a base layer, an adjacent layer of a radiation hardenable elastomer material (curable layer), and optionally, an infrared sensitive layer which is used to form an in situ mask on the curable layer using laser radiation prior to exposure to actinic radiation, such as by laser ablation. Example photosensitive printing elements processable in the thermal-based developing system of the invention are described in U.S. Pat. No. 5,175,072 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

In one embodiment, and prior to processing in the thermal developing assembly described herein, a portion of the radiation curable layer is preferably cured by actinic radiation through the lower surface of the base to create a cured "floor layer." Next, the film is imagewise exposed from the opposite surface to cure the desired portions of the plate, through either a photographic negative or the in situ negative created by laser ablation of the mask layer. The remaining portion of the radiation curable layer after curing consists of cured portions and uncured portions. Thereafter, the photosensitive printing element is transferred to the thermal developing assembly to remove uncured portions of the radiation curable layer and reveal the relief image therein, wherein the relief image is made up of the crosslinked and cured portions of the radiation curable layer of the photosensitive printing element.

A conveyor 16 attached to a drive motor (not shown) is typically used to transport and convey the photosensitive printing element 14 into and through the thermal plate processing system. The conveyor 16 may be mounted in a fixed position in the enclosure 12 and includes a continuous loop 17 supported by at least a first roller 18 and a second roller 20. Optionally, one or more additional rollers (not shown) may be used to provide additional support to the conveyor 16 and prevent the continuous loop 17 from sagging from the weight of the photosensitive printing element 14. In one embodiment, the continuous loop 17 comprises a wire mesh.

The leading edge of the photosensitive printing element 14 may be held in place against the continuous loop 17 of the conveyor 16 by suitable fastening means (not shown), such as a clamp and/or vacuum. In one embodiment, a vacuum is provided to at least one of the first roller 18 and the second roller 20 of the conveyor 16, and used, alone or in combination with the fastening means, to hold the photosensitive printing element 14 in place on the continuous loop 17 of the conveyor 16.

During operation, the conveyor 16 with the photosensitive printing element 14 mounted thereon moves in a first direction 22 towards a heatable roller 24 such that the photosensitive printing element 14 passes through a gap 26 between the conveyor 16 and the heatable roller 24 as the continuous loop 17 of the conveyor 16 rotates over and around a second roller 20. In one embodiment, a heatable roller 24 rotates in an opposite direction 28 from the conveyor 16. The heatable roller 24 is capable of being urged towards the photosensitive printing element 14 positioned on the conveyor 16 as the conveyor moves in the first direction 22 and the heatable roller 24 moves in an opposite direction 28. Preferably, the heatable roller 24 is fixably mounted on a pivot (not shown), which allows it to be urged towards the conveyor 16.

In some embodiments, the heatable roller 24 is urged toward the photosensitive printing element 14 on the conveyor 16 using suitable means, such as one or more pneumatic cylinders (not shown). The pneumatic cylinder(s)

positions the heatable roller 24 at a preset distance from the outer surface of the second roller 20 of the conveyor 16 to produce the gap 26 through which the photosensitive printing element 14 passes as it travels on the continuous loop 17 of the conveyor 16 around the second roller 20.

The web of absorbent material 32 is conducted over at least a portion of an outer surface 30 of the heatable roller 28. The web of absorbent material 32 is capable of absorbing (e.g., removing) uncured material that is liquefied or softened from the photosensitive printing element 14 when the heatable roller 24 rotates and is heated and the web of absorbent material 32 contacts at least a portion of the photosensitive printing element 14. The heatable roller 24 rotates in a direction 28 that is opposite to the direction 22 of the conveyor 16 so that the photosensitive printing element 14 and the web of absorbent material 32 can be contacted with each other and then separated.

Heat may be provided to the heatable roller 24 by a core heater that is capable of maintaining a skin temperature of the heatable roller 24 that will soften or liquefy at least a portion of the photosensitive material. The temperature to which the heatable roller 24 is heated is chosen based on the composition of the photosensitive material and is based on the melting temperature of the monomers and polymers contained within the photosensitive material. In one embodiment, the heatable roller 24 is heated to and operated at a temperature between about 150° C. and about 250° C. The upper limit may be determined in large part by the melting temperature of the web of absorbent material 32. That is, the temperature of the heatable roller 24 must be low enough so that when the web of absorbent material 32 is not moving and the portions of the web of absorbent material 32 contacting the heatable roller 24 are at rest and the absorbent material 32 does not melt. Although the heatable roller 24 preferably includes an electrical core heater to provide the desired skin temperature, the use of steam, oil, hot air, and a variety of other heating sources may also provide the desired skin temperature.

The web of absorbent material 32 is supplied to at least the portion of the outer surface 30 of the heatable roller 24 from a supply roll 34 of the web of absorbent material 32. The selection of the absorbent material 32 may depend in part upon the thickness of the photosensitive printing element 14 to be processed, the melting temperature of the web of absorbent material 32, and the heat transfer characteristics of both the photosensitive printing element 14 and the web of absorbent material 32. The web of absorbent material 32 may be non-woven or woven and suitable absorbent materials would be known to those skilled in the art and are usable in the present invention.

During operation, vapors (e.g., fumes) may be released into the enclosure 12 as the portion of the photosensitive material is heated and then liquefies or softens. The vapors may contain contaminants and irritants of photopolymer that may be harmful to the environment and a user. Thus, it is imperative that the vapors, and any byproduct thereof, along with the uncured photosensitive material, the contaminants, or any combinations thereof be treated and disposed of in a manner that limits (or eliminates) any harmful impact.

In some embodiments, the vapors 42 may be directed through a heat exchanger 44 whereby the vapors 42 are condensed. Thereafter, the resulting condensate 46 may be collected for removal. Although the removal of the condensate 46, contaminants, and/or uncured photosensitive material may be accomplished in their liquified state (e.g., in a container), the removal of the byproduct (i.e., vapor, partially liquid, liquid, and combinations thereof) poses potential harm to the environment and the user. Thus, the byproducts are preferably exposed to a light source to crosslink and cure the byproduct to ensure ease of disposal with reduced (or eliminated) reactivity.

In some embodiments, the heat exchanger 44 may be positioned within a second enclosure 40, which may be positioned within the enclosure 12 such that the vapors 42 are directed towards the heat exchanger 44 positioned within the second enclosure 40.

The system 10 may also include a means for delivering the byproduct from a first position to a second position. In one embodiment, the first position may be before the heat exchanger 44, after the heat exchanger 44, or both before and after the heat exchanger 44. The second position may include a supplementary holding container (not shown), the absorbent material 32, or close proximity thereto.

In some embodiments, the byproduct may be delivered by a pump 52 through one or more pipes, hoses or the like 54. The speed at which the pump transports the byproduct may depend at least in part on the speed in which the absorbent material 32 is traveling as well as the amount of byproduct that is collected. The pipe 54, for example near the second position, may include several outlet holes such that the byproduct is distributed evenly along the absorbent material at a speed that corresponds with the speed of the absorbent material 32, thereby maximizing the absorption capabilities of the absorbent material 32.

In some embodiments, the system 10 may include a means for delivering at least the condensate 46 (and any other byproduct associated therewith) from the first position after the heat exchanger 44 (e.g., collection area 47) to the absorbent material 32, the second position. The absorbent material 32 may at least partially absorb the condensate 46 (and any other byproduct associated therewith). As shown in FIG. 1, this second position where the byproduct is delivered and/or deposited is at a location on the web of absorbent material 32 after the photosensitive printing element 14 has contacted the web of absorbent material 32 and prior to take-up roller 38. Thus, the web of absorbent material 32 has deposited therein softened or liquefied photopolymer removed from the photosensitive printing element 14. By using the thermal developing assembly described herein, the web of absorbent material is reused to capture additional material (i.e., the byproduct) for disposal.

As is also evident from the thermal developing assembly described herein, the web of absorbent material captures softened or liquefied photopolymer removed from the photosensitive printing element 14 on a first side and capture the byproduct on a second or opposite side of the web of absorbent material 32.

As depicted in FIGS. 4A-4C, the system 10 may further include an applicator 56 that is in fluid communication with the means for delivering the byproduct (e.g., condensate 46) to the absorbent material 32 (e.g., a pump and pipe 54). For example, the applicator 56 may be configured to at least partially distribute the byproduct along at least a surface of the absorbent material 32. Particularly, the applicator may be used to control the width and/or the quantity (e.g., thickness) of the byproduct on the at least one surface of the absorbent material 32 such that the byproduct is distributed uniformly.

FIGS. 4A and 4B depict a thermal-based developing system including an applicator 56 that is positionable in close proximity to an absorbent material 32 and in fluid communication with a pipe 54 for delivering condensate 46 to a surface of the absorbent material 32. The applicator 56 may be positionable at a location along the absorbent material 32 before the UV light sources 48, 50, based on the direction that the absorbent material 32 travels around a heatable roller 24 (see the arrow illustrated in FIG. 4A). In some instances, the applicator 56 and/or at least a portion of the pipe 54 may be movable in relation to the absorbent material 32. For example, when the absorbent material 32 is moving, the applicator 56 may be situated in close proximity to a surface of the absorbent material 32, as depicted in FIG. 4A and when the absorbent material 32 is stopped, the applicator 56 may be situated at a position distanced from the absorbent material 32, as depicted in FIG. 4B. The ability to move the applicator 56 and/or at least a portion of the pipe 54 may facilitate an easier removal/installation of the absorbent material 32 and/or other component(s).

FIG. 4C depicts the applicator 56 positionable in fluid communication with the pipe 54, which is configured to deliver, at least in part, byproduct (e.g., condensate 46) to a surface of the absorbent material 32. The applicator may include bristles 58 or the like (e.g., in a paint brush-like configuration) and may be configured such that the condensate passes through the bristles 58 of the applicator 56. The bristles 58 may help to regulate the flow from the pump/pipe 54 to evenly distribute the condensate 46 onto at least one surface of the absorbent material 32.

In some instances, as the condensate is delivered through a pump and pipe, air may also be sucked up which can cause the condensate to sputter as it is being delivered to a surface of the absorbent material. In such instances, positioning the applicator 56 in fluid communication with the pump and pipe may help to facilitate an even distribution of the condensate onto the surface of the absorbent material 32. Particularly, the bristles 58 of the applicator 56 may act as a reservoir for storing the condensate so as to damp the sputtering of the condensate/air mixture that is being delivered through the pump/pipe to the absorbent material. The bristles 58 of the applicator 56 may have a width that is approximately the width of the one or more UV light sources 48, 50 and/or the width of the absorbent material. Thus, the applicator 56 would spread the condensate in a width that is consistent with the width of the one or more UV light sources and/or the absorbent material. By evenly distributing the condensate for thinner application on the at least one surface of the absorbent material 32, less intensity and/or exposure time may be required to crosslink and cure the condensate.

In some embodiments, the system 10 may further include a UV light source. The UV light source (e.g., UV LED, UV fluorescent) 50 may be positioned in close proximity to the absorbent material 32 and on an opposite side of the web of absorbent material. In some instances, the UV light source 50 may also cure the liquefied or softened material that has been absorbed by the web of absorbent material 32. In other embodiments, the UV light source 50 may cure the condensate 46 that has been absorbed by the absorbent material 32. In even other embodiments, the UV light source 50 may cure the liquefied or softened material and the condensate 46 that has been absorbed by the absorbent material 32. The selected wavelength may be related to (depend on) characteristics of a photoinitiator (e.g., curing point). In a non-limiting example, the wavelength of the UV light source may be between about 365 nm to about 405 nm.

The desired intensity of the UV light source may be at least partially associated with at least one of the following, including but not limited to, the speed of the web of absorbent material, the quantity and/or uniformity of the byproduct (e.g., the thinner the byproduct is applied to the web of absorbent material, the less intensity required and/or the less time required to cure the byproduct), the proximity of the UV light source to the byproduct (e.g., the web of absorbent material that has absorbed the byproduct), the wavelength of the UV light source, the operating parameters of the UV light source (e.g., the number of LEDs in an LED array), and combinations of the foregoing. Thus, depending in part on the intensity of the UV light source and the particular type of substrate material, more than one pass of the UV light source over the absorbent material and/or multiple UV light sources (i.e., LED array) may be required to completely cure the byproduct.

In some embodiments, the system 10 may include a second UV light source 48. For example, the system 10 may include at least two UV light sources 48 and 50. The second UV light source (e.g., UV LED, UV fluorescent) 48 may be positioned in close proximity to the first UV light source 50. The second UV light source 48 may be positioned adjacent to the first UV light source 50. The second UV light source 48 may be positioned opposite from the first UV light source 50. For example, in one preferred embodiment, the second UV light source 48 may be positioned opposite from the first UV light source 50 such that the second UV light source 48 crosslinks and cures softened or liquefied photopolymer or byproducts on the first side surface of the absorbent material 32. The at least two UV light sources 48, 50 may be positioned opposite each other and relative to the absorbent material 32 such that byproduct that has been absorbed by or in contact with the absorbent material 32 may be exposed to UV light so as to partially (or fully) cure the byproduct. In a non-limiting example, the wavelength of the second UV light source 48 may be between about 365 nm to about 405 nm. In another non-limiting example, the desired intensity of the second UV light source 48 may be at least partially associated with the elements of the first UV light source 50, as defined above. The wavelength and/or the intensity of the UV light source 50 and the second UV light source 48 may be similar to one another or may be different from one another.

In one embodiment, the system 10 includes two UV light sources 48, 50 (e.g., UV LEDs, UV fluorescent) that are oppositely positioned relative to the absorbent material 32, wherein the first UV light source 50 is positioned on one side of the absorbent material 32 and the second UV light source 48 is positioned on an opposite side of the absorbent material 32. The absorbent material 32 may be configured to move in a first direction based on the direction 28 of the heatable roller 24. The condensate 46 (and any other byproduct associated therewith) is transported to the absorbent material 32 such that the absorbent material 32 absorbs at least a portion of the condensate 46. Preferably the condensate 46 is transported to a position before the UV light sources 48, 50 such that as the absorbent material 32 travels in close proximity to the UV light sources 48, 50, the condensate 46, the uncured photosensitive material, and any other byproduct associated therewith is crosslinked and cured. Then, the absorbent material 32, containing the cured and nonreactive byproduct, can be wound onto a take-up roller for subsequent removal and/or disposal.

The take-up roller 38 is independently belt driven by a motor (not shown), which is preferably a variable speed motor. The take-up roller 38 collects the "used" web of absorbent material 32 after it has contacted the photosensitive printing element 14 and removed portions of the photosensitive material that were liquefied or softened and collected and has collected the vapor and/or liquid byproducts 42, 46. The speed of the motor is adjusted so as to not interfere with the selected web tension. If the motor interferes with web tension, the resulting flexographic plate could potentially have variable heights in the relief portions or might warp and be commercially unacceptable.

In another embodiment, and as depicted in FIG. 2, system 100 may include at least one UV light source 104 positionable along a path 102 where the vapor 42 may travel and/or at a position where the vapor 42 may be collected. The UV light source 104 (e.g., UV LED, UV fluorescent) may cure the contents of the vapor 42 such that the cured portions may be captured in a filter 106 positioned relative thereto. For example, the filter 106 may be positioned within the path 102 of the vapor 42. Thereafter, vapor that is now free (or at least partially free) of contaminants 108 may be reintroduced into the enclosure 12 or may be directed to another location (e.g., a location outside the enclosure 12).

In still another embodiment, and as depicted in FIG. 3, system 200 may include a means for delivering the byproduct (e.g., the condensate 46) to a supplementary holding tank 204 or pipe/hose (not shown). The system 200 may also include a means for collecting at least the condensate 46 in a supplementary holding tank 204. The system 200 may include a heat exchanger 44 that is configured to condense the vapors 42 produced in the thermal developing assembly when the photosensitive printing element 14 is heated and portions of the radiation curable layers soften or liquefy. The condensate 46 may be delivered from the heat exchanger 44 to the supplementary holding tank 204. In some embodiments, the heat exchanger 44 may be positioned within enclosure 202.

At least one UV light source (e.g., UV LED, UV fluorescent) may be positionable in proximity to the supplementary holding tank or pipe/hose to crosslink and cure the collected and/or delivered byproduct (e.g., the condensate 46). For example, the UV light source 206 may be positioned in close proximity to the delivery means and/or the collection means (e.g., the supplementary holding tank 204). In some embodiments, the UV light source 206 may crosslink and cure the condensate 46 for subsequent removal. In a non-limiting example, the cured byproduct (e.g., condensate 46) may resemble pellets 208 and once crosslinked and cured may be nonreactive and easily disposed of. However, it is appreciated that the crosslinked and cured byproduct may resemble other shapes and should not be limited to only pellets.

In another embodiment, the system 10 may include a secondary heating source (not shown) that may be positioned adjacent to a point where the absorbent material 32 contacts the at least one layer of photosensitive material on the conveyor 16. The secondary heating source may provide an auxiliary heat source to further soften and liquefy portions of the at least one layer of photosensitive material on the conveyor 16.

It should be apparent to one skilled in the art that the conveyor 16, including first roller 18 and second roller 20 as well as the heatable roller 24 are driven by suitable means, i.e., a motor. In addition, a controller, such as a microprocessor may be used in the system of the invention to control the operation of each of the elements in the plate processor 10. Such controllers are well known in the art. One example of a controller used to control the various elements in a plate processor is described in U.S. Pat. No. 5,279,697 to Peterson et al., the subject matter of which is herein incorporated by reference in its entirety.

The present disclosure is also directed to a method of treating vapor and/or liquid byproducts produced in a thermal development process of making a relief image printing element, wherein a photosensitive printing element includes a flexible substrate and at least one layer of photosensitive material deposited on the flexible substrate using the system described above.

The method includes the steps of (1) positioning a photosensitive printing element 14 on a conveyor 16, the conveyor 16 including a continuous loop 17 supported by at least a first roller 18 and a second roller 20, wherein the photosensitive printing element 14 is supported on the continuous loop 17; (2) supplying an absorbent material 32 to at least a portion of an outer surface 30 of a heatable roller 24 that is mounted for rotation in the enclosure 12, wherein the absorbent material 32 is capable of absorbing a byproduct material that is associated with forming the relief image on the photosensitive printing element 14 at least when the heatable roller 24 is heated and rotates and the absorbent material 32 contacts at least a portion of the photosensitive printing element 14; (3) heating the heatable roller 24 to a temperature sufficient to cause at least a portion of the at least one layer of photosensitive material to soften or liquefy when the absorbent material 32 contacts the at least one layer photosensitive material; (4) causing a surface of the at least one layer of photosensitive material and the absorbent material 32 to come into contact at a point between the conveyor 16 and the heatable roller 24 such that at least a portion of the liquefied or softened material is absorbed by the absorbent material 32; and (5) collecting vapor and/or liquid byproducts 42, 46 produced in the thermal development process when the photosensitive printing element 14 is heated and a portion of the photosensitive printing element 14 liquefies and softens; and (6) exposing the vapor and/or liquid byproducts 42, 46 to at least one UV light source 48, 50 to crosslink and cure the vapor and/or liquid byproducts 42, 46.

Preferably, the photosensitive printing element is processed through the steps of the process several times so that most, if not all of the uncured photosensitive material may be removed from the surface of the photosensitive printing element to obtain the relief image.

Suitable means for maintaining uniform tension in the web of absorbent material throughout the system may be used, including for example, one or more idler rollers 36. Other means for maintaining tension in the web may also be provided and would be known to those skilled in the art.

In some embodiments, one or more idler rollers 36 may be positioned in direct or indirect contact with the web of absorbent material 32. The one or more idler rollers 36 may facilitate a change in direction of the web of absorbent material 32 and/or may provide tension to the web of absorbent material 32 to maintain a uniform and desired tension. In some instances, two or more idler rollers 36 may be positioned in close proximity to each other. For example, two or more idler rollers 36 may be positioned in close proximity to each other such that the web of absorbent material 32 is closely wound (i.e., makes a sharp turn) in order to maintain at least partial contact with an exterior surface of each of the two or more idler rollers 36.

In some embodiments, the linear speed of the heatable roller 24, the web of absorbent material 32, and the photosensitive printing element 14 may be substantially the same to avoid any shear stress on the photosensitive printing element 14. The disclosed shear stress can cause uneven relief portion plate thickness.

The invention will now be described in reference to the following non-limiting example.

Example 1

A liquid condensate produced in a thermal developing assembly was applied to two side-by-side locations on a surface of an absorbent material of a LAVA® 4260 platemaking machine (produced by MacDermid Graphics Solutions, Atlanta, Ga.). Each location of the absorbent material contained a representative amount of liquid condensate that is consistent with the quantity of liquid condensate generated on each pass of the LAVA® machine.

The first location on the absorbent material with the liquid condensate was exposed to UV light of 365 nm wavelength with a maximum intensity of approximately 14.3 to 14.55 mW/cm$^2$ (measured 10 mm from the front window of the light source).

The second location on the absorbent material with the liquid condensate was left untouched and not exposed to UV light. The absorbent material was traveling at 3 ft/min.

The UV light source had a total lamp power of 20 watts, resulting in 8 watts at 365 nm UV after conversion losses.

As illustrated in FIG. 5, the first location (left) on the absorbent material after the liquid condensate was exposed to UV light was dry to the touch (crosslinked and cured) in approximately 2 to 3 passes under the UV light source. The area depicted in the left area of FIG. 4 illustrates that the condensate was dried and polymerized after 2 passes under the UV light source. In contrast, the second location (right) on the absorbent material in which the liquid condensate was not exposed to UV light remained wet. The area depicted in the right area of FIG. 4 shows the weave of the absorbent material visible in the sample, demonstrating that the liquid condensate remained wet.

Based thereon, it was determined that a single UV light source producing 8 watts of power at 365 nm UV can cure the representative amount of liquid condensate absorbed by the absorbent material, traveling at roughly 3 ft/min, in approximately 2 to 3 passes under the UV light source.

With the use of two or more UV light sources (e.g., UV LED modules), it is expected that that the liquid condensate will crosslink and cure in less passes and/or at a faster processing speed than recited in Example 1. It is also noted that liquid condensate absorbed on a paper substrate was completely polymerized in 1 pass under the above-referenced UV light source.

Although the present disclosure has been described with reference to exemplary implementations, the present disclosure is not limited by or to such exemplary implementations. Rather, various modifications, refinements and/or alternative implementations may be adopted without departing from the spirit or scope of the present disclosure.

The invention claimed is:

1. A system for treating vapor and/or liquid byproducts produced in a thermal developing assembly, wherein the thermal developing assembly accepts a photosensitive printing element comprising one or more radiation curable layers, wherein the one or more radiation curable layers are subject to imagewise exposure to actinic radiation to crosslink and cure portions of the one or more radiation curable layers prior to processing of the photosensitive printing element in the thermal developing assembly, wherein uncured portions of the one or more radiation curable layers are removable in the thermal developing assembly to reveal a relief structure in the photosensitive printing element by contacting the one or more radiation curable layers with a web of absorbent material at an elevated temperature to soften or liquefy the uncured portions of the one or more radiation curable layers, wherein the softened or liquefied uncured portions are absorbable into the web of absorbent material, and wherein vapor and/or liquid byproducts are produced in the thermal developing assembly when the photosensitive printing element is heated and portions of the one or more radiation curable layers soften or liquefy, wherein the system comprises:
    a conveyor comprising a continuous loop wherein the photosensitive printing element is positionable on the continuous loop of the conveyor, wherein the conveyor rotates in a first direction;
    at least one mounted rotatable heatable roller positionable relative to the conveyor such that a gap of a predetermined distance is defined therebetween, wherein the at least one heatable roller rotates in a second direction that is opposite the first direction;
    an absorbent material covering at least a portion of the at least one heatable roller, wherein the absorbent material is capable of absorbing liquefied or softened uncured photosensitive material from the photosensitive printing element when the photosensitive printing element comes into contact with the absorbent material on a portion of the at least one heatable roller, wherein the photosensitive printing element comes into contact with the absorbent material at least partially within the gap;
    a collection area for collecting vapor and/or liquid byproducts produced in the thermal developing assembly;
    a pump configured to deliver vapor and/or liquid byproducts from the collection area to a surface of the web of absorbent material, wherein the vapor and/or liquid byproducts are delivered to the surface of the web of absorbent material at a location that is subsequent to a location where the photosensitive printing element has been brought into contact with the web of absorbent material; and
    at least one UV light source positionable to crosslink and cure the collected and/or delivered vapor and/or liquid byproducts for subsequent removal.

2. The system according to claim 1, wherein the vapor and/or liquid byproducts include vapors associated with heating the liquefied or softened uncured photosensitive material, condensate associated with condensing the vapors, the liquefied or softened uncured photosensitive material, and combinations thereof.

3. The system according to claim 1, wherein the collection area comprises a condensation system configured to condense at least a portion of the vapors produced by heating the photosensitive material into a condensate.

4. The system according to claim 1, wherein the vapor and/or liquid byproducts are delivered to the absorbent material previously used to remove the liquefied or softened uncured photosensitive material, such that the web of absorbent material absorbs the vapor and/or liquid byproducts and the web of absorbent material containing at least the vapor and/or liquid byproducts are exposed to the at least one UV light source.

5. The system according to claim 1 further comprising an applicator positioned in close proximity to the surface of the web of absorbent material and in fluid connection with the pump, wherein the applicator is configured to uniformly distribute the vapor and/or liquid byproducts onto the surface of the web of absorbent material.

6. The system according to claim 1, wherein the at least one UV light source includes a UV LED light source, a UV fluorescent light source and combinations thereof.

7. The system according to claim 1, wherein the at least one UV light source operates in a wavelength range of about 365 nm to about 405 nm to crosslink and cure at least the vapor and/or liquid byproducts.

8. The system according to claim 1, wherein the at least one UV light source operates in an intensity range of approximately 14.3 to about 14.55 mW/cm² measured at a distance of 10 mm from the at least one UV light source to crosslink and cure at least the vapor and/or liquid byproducts.

9. The system according to claim 1, wherein the at least one UV light source comprises two UV light sources that are oppositely positioned and mounted with respect to the web of absorbent material.

10. A method for treating vapor and/or liquid byproducts produced in a thermal developing assembly during a thermal development process, wherein the thermal developing assembly accepts a photosensitive printing element comprising one or more radiation curable layers, wherein the one or more radiation curable layers are subject to imagewise exposure to actinic radiation to crosslink and cure portions of the one or more radiation curable layers prior to processing of the photosensitive printing element in the thermal developing assembly, wherein uncured portions of the one or more radiation curable layers are removed in the thermal developing assembly to reveal a relief structure in the photosensitive printing element by contacting the one or more radiation curable layers with a web of absorbent material at an elevated temperature to soften or liquefy the uncured portions of the one or more radiation curable layers, wherein the softened or liquefied uncured portions are absorbable into the absorbent web, and wherein vapor and/or liquid byproducts are produced in the thermal developing assembly when the photosensitive printing element is heated and portions of the one or more radiation curable layers soften or liquefy, wherein the method comprises:
　a. collecting vapor and/or liquid byproducts produced in the thermal developing assembly in a collection area;
　b. pumping the vapor and/or liquid byproducts from the collection area to a surface of the web of absorbent material, wherein the vapor and/or liquid byproducts are delivered to the surface of the web of absorbent material at a location that is subsequent to a location where the photosensitive printing element has been brought into contact with the web of absorbent material; and
　c. exposing the vapor and/or liquid byproducts to at least one UV light source to crosslink and cure the collected and/or delivered vapor and/or liquid byproducts.

11. The method according to claim 10, wherein the vapor and/or liquid byproducts comprise vapors associated with heating the liquefied or softened uncured photosensitive material, condensate associated with condensing the vapors, the liquefied or softened uncured photosensitive material, and combinations thereof.

12. The method according to claim 10, wherein the at least one UV light source includes a UV LED light source, a UV fluorescent light source and combinations thereof.

13. A system for treating liquid condensate produced in a thermal developing assembly, wherein the thermal developing assembly accepts a photosensitive printing element comprising one or more radiation curable layers, wherein the one or more radiation curable layers are subject to imagewise exposure to actinic radiation to crosslink and cure portions of the one or more radiation curable layers prior to processing of the photosensitive printing element in the thermal developing assembly, wherein uncured portions of the one or more radiation curable layers are removed in the thermal developing assembly to reveal a relief structure in the photosensitive printing element by contacting the one or more radiation curable layers with a web of absorbent material at an elevated temperature to soften or liquefy the uncured portions of the one or more radiation curable layers, wherein the softened or liquefied uncured portions are absorbable into the absorbent web, and wherein the liquid condensate is produced in the thermal developing assembly when the photosensitive printing element is heated and portions of the one or more radiation curable layers soften or liquefy, wherein the system comprises:
　a conveyor comprising a continuous loop wherein the photosensitive printing element is positionable on the continuous loop of the conveyor, wherein the conveyor rotates in a first direction;
　at least one mounted rotatable heatable roller positionable relative to the conveyor such that a gap of a predetermined distance is defined therebetween, wherein the at least one heatable roller rotates in a second direction that is opposite the first direction;
　an absorbent material covering at least a portion of the at least one heatable roller, wherein the absorbent material is capable of absorbing liquefied or softened uncured photosensitive material from the photosensitive printing element when the photosensitive printing element comes into contact with the absorbent material on a portion of the at least one heatable roller, wherein the photosensitive printing element comes into contact with the absorbent material at least partially within the gap;
　a collection area for collecting vapor and/or liquid byproducts produced in the thermal developing assembly;
　a pumping device configured to deliver the liquid condensate from the collection area to a surface of the web of absorbent material, wherein the vapor and/or liquid byproducts are delivered to the surface of the web of absorbent material at a location that is subsequent to a location where the photosensitive printing element has been brought into contact with the web of absorbent material;
　an applicator positioned in close proximity to the surface of the web of absorbent material and in fluid connection with the pump, wherein the applicator is configured to uniformly distribute the vapor and/or liquid byproducts onto the surface of the web of absorbent material; and
　at least one UV light source mounted with respect to the web or absorbent material, wherein the at least one UV light source is positionable to crosslink and cure at least the absorbed liquid condensate for subsequent removal.

14. The system according to claim 13, wherein the at least one UV light source operates in a wavelength range of about 365 nm to about 405 nm to crosslink and cure at least the vapor and/or liquid byproducts.

15. The system according to claim 13, wherein the at least one UV light source operates in an intensity range of approximately 14.3 to about 14.55 mW/cm² measured at a distance of 10 mm from the at least one UV light source to crosslink and cure at least the vapor and/or liquid byproducts.

16. The system according to claim 13, wherein the at least one UV light source includes a UV LED light source, a UV fluorescent light source and combinations thereof.

17. The system according to claim 13, wherein the collection area comprises a condensation system configured to condense at least a portion of the vapors produced by heating the photosensitive material into the liquid condensate.

18. The system according to claim 13, wherein the at least one UV light source comprises two UV light sources that are oppositely positioned and mounted with respect to the absorbent material and are configured to crosslink and cure the vapor and/or liquid byproducts.

19. The system according to claim 13, wherein the pumping device delivers the liquid condensate to a position along the web of absorbent material before the web of absorbent material is exposed to the at least one UV light source.

* * * * *